(12) United States Patent
Frederick (10) Patent No.: US 8,136,072 B2
(45) Date of Patent: Mar. 13, 2012

(54) STANDARD CELL PLACEMENT (75) Inventor: Marlin Wayne Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 497 days.

(21) Appl. No.: 12/289,771

(22) Filed: Nov. 3, 2008

(65) Prior Publication Data
US 2010/0115484 A1    May 6, 2010

(51) Int. Cl.
*G06F 17/50* (2006.01)
(52) U.S. Cl. .............. 716/119; 716/55; 716/139
(58) Field of Classification Search .......... 716/55, 716/119, 139
See application file for complete search history.

(56) References Cited

U.S. PATENT DOCUMENTS

7,069,532 B2 * 6/2006 Barney et al. .......... 716/126
7,873,929 B2 * 1/2011 Kahng et al. .......... 716/118
* cited by examiner

*Primary Examiner* — Thuan Do
(74) *Attorney, Agent, or Firm* — Nixon & Vanderhye P.C.

(57) ABSTRACT

A method of generating a layout of an integrated circuit is provided, the method comprising the steps of: providing functional data representing circuit elements and connections between the circuit elements, providing a cell library defining a plurality of standard cells, each standard cell representing a potential component for forming the integrated circuit, providing compatibility information indicative of the compatibility of the boundaries of the standard cells, and generating a placement of standard cells in dependence on the functional data and the compatibility information to produce the layout such that no abutting cells have incompatible boundaries.

18 Claims, 9 Drawing Sheets

STANDARD CELL PLACEMENT

BACKGROUND OF THE INVENTION

1. Field of the Invention

This invention relates to the field of integrated circuits, and in particular to generating the layout of such integrated circuits.

2. Description of the Prior Art

In the design of semiconductor integrated circuits, it is known to provide automated tools which use a functional design of a planned integrated circuit (for example in the form of a gate level netlist or a Register Transfer Language higher level representation of the design) and a cell library providing a set of standard cells (the standard cells being "building blocks" for putting together the layout of the integrated circuit according to the functional design) in order to generate the layout of an integrated circuit.

Typically, the standard cells are arranged in rows by the automated tool and (considering the rows as running horizontally) the left and right boundaries of each standard cell are such that any given cell may be placed next to any other given standard cell. Thus the automated tool has free choice in which standard cells are placed where in order to fulfill the requirements of the functional design with a low routing overhead.

Figure 1A:
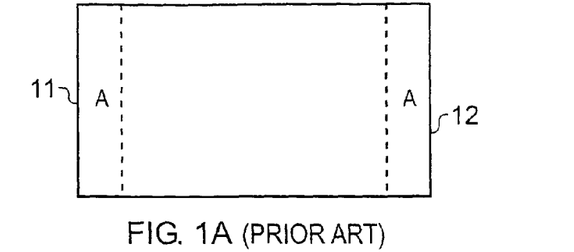
FIGS. 1A, 1B, 1C and 1D schematically illustrate known standard cells.
Figure 1B:
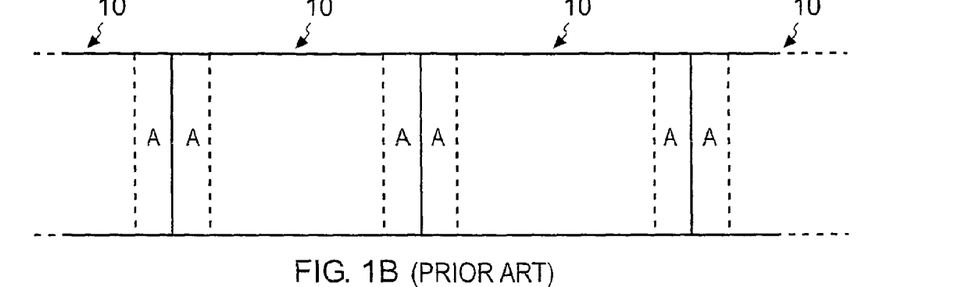

FIG. 1A schematically illustrates a known standard cell 10, having left and right boundaries 11 and 12 respectively. Boundary regions associated with these boundaries are labelled as "A". The dashed lines delimiting the boundary regions A from the main part of the standard cell 10 can be thought of as designating a region into which elements of the standard cell may not extend, in order to ensure that when another standard cell is placed abutting this standard cell no unwanted interactions between the elements of each standard cell will occur. In reality different elements within the standard cell (e.g. polysilicon, metal, etc.) will have different minimum distances from the boundary, according to predetermined design rules, however the boundary regions A generally illustrate a single minimum distance. When every standard cell (regardless of the particular arrangement of that standard cell) has boundaries such as those illustrated in FIG. 1A, then any standard cell may be placed abutting any other standard cell, as is schematically illustrated in FIG. 1B.

Figure 1C:
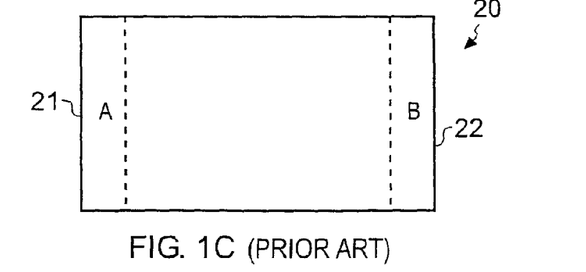
Figure 1D:
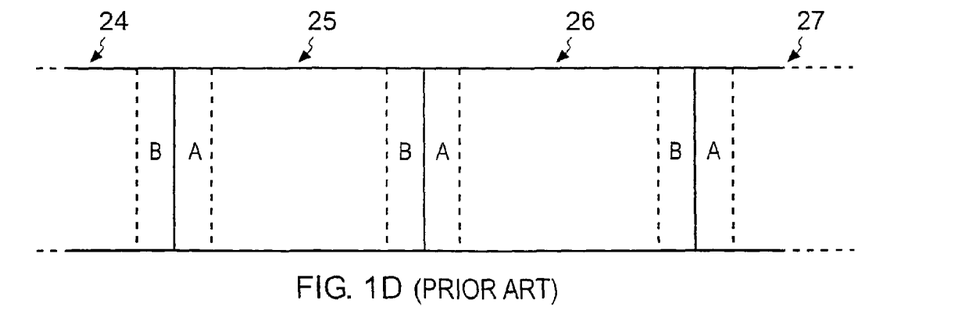

Similarly it is also known in the prior art for a standard cell to be configured such that it may only be placed in a layout in one orientation. Such a standard cell 20 is schematically illustrated in FIG. 1C. This standard cell 20 has left and right boundaries 21 and 22 respectively, which are characterized by having boundary regions A and B respectively. In this case it is necessary to place an "A" boundary next to a "B" boundary when arranging standard cells together, as is schematically illustrated in FIG. 1D. Here, standard cells 24, 25, 26 and 27 of the type illustrated in FIG. 1C are arranged in a row, such that any two standard cells meet with a "B" boundary region adjacent to an "A" boundary region. However, "A" may not be placed next to "A" and "B" may not be placed next to "B", so it is not possible for the tool arranging the standard cells to "flip" any given cell (e.g. left-right reversing standard cell 26 in FIG. 1D), since then a "B-B" and a "A-A" abutment of standard cells would occur.

As the geometries of semiconductor integrated circuits become ever smaller, there is a growing pressure for the functionality of each standard cell to be implemented in an ever smaller area.

It would be desirable to allow this progression to ever smaller integrated circuits to continue, whilst still taking advantage of such automated tools for arranging the layout of these integrated circuits.

SUMMARY OF THE INVENTION

A first aspect of the present invention provides a method of generating a layout of an integrated circuit, said method comprising the steps of: providing functional data representing circuit elements and connections between said circuit elements of said integrated circuit; providing a cell library defining a plurality of standard cells, each standard cell representing a potential component for forming said integrated circuit; providing compatibility information indicative of compatibility of boundaries of said standard cells; and generating a placement of standard cells in dependence on said functional data and said compatibility information to produce said layout such that no abutting cells have incompatible boundaries.

The present invention recognizes that the progression towards ever smaller integrated circuit geometries may be assisted by providing a set of standard cells of which not all standard cells may be placed next to any other standard cell. That is to say, some of the standard cells have boundaries which are incompatible with the boundaries of other standard cells. By allowing standard cells to have incompatible boundaries, the design rules governing where elements of a given standard cell may be positioned on that standard cell may be relaxed, enabling a greater density of functional components to fit onto a given area of standard cell.

Due to the introduced incompatibility between certain standard cells, the present technique provides compatibility information indicating which standard cell boundaries are compatible with each other. Hence, an automated tool for generating a layout of an integrated circuit can combine functional data (e.g. netlist or RTL) representing the desired configuration of an integrated circuit with a cell library defining standard cells, and making use of the compatibility information can generate an arrangement of standard cells in accordance with the functional data such that no abutting cells have incompatible boundaries.

The incompatible boundaries between particular standard cells could have a range of causes, but in one embodiment the incompatible boundaries result from positions of elements of respective standard cells relative to their respective standard cell boundaries. Due to the design rules specifying how close each element of a standard cell may be positioned to a boundary of that standard cell, violating one of these rules can result in an incompatible boundary between that standard cell and an abutting standard cell.

In one embodiment said integrated circuit is formed from layers on a substrate and said incompatible boundaries result from proximity of at least one of said layers to a standard cell boundary. The position of these layers relative to the standard cell boundary then influences the compatibility of that boundary with respect to other standard cells. Hence, whilst according to standard design rules a given layer should not come closer than a predetermined distance to the standard cell boundary, allowing this layer to come closer to the standard cell boundary results in that boundary being incompatible with some other standard cells.

It will be appreciated by those skilled in the art to that these layers could take a variety of forms, but in one embodiment, said one of said layers is one of a polysilicon layer, a diffusion layer, a contact layer, a via layer and a metallization layer.

Each of these varieties of layer will have predetermined design rules specifying how close they may be positioned to a standard cell boundary.

In one embodiment the layers are collinear layers. As semiconductor geometries become ever smaller, generating layers on the substrate at the required resolution necessitates those layers being formed as collinear layers.

It will be appreciated that there could be a great number of standard cells, but in one embodiment the plurality of standard cells comprises at least three types of standard cell, said at least three types of standard cell having different compatibility of boundaries from one another. As a consequence it will further be appreciated that there can then be a great number of compatibility rules between the standard cells, but in one embodiment the plurality of standard cells comprises at least one type of standard cell having boundaries which are compatible with all other types of standard cell. In one embodiment the plurality of standard cells comprises at least one type of standard cell having a standard cell boundary which is only compatible with one other type of standard cell boundary.

In another embodiment the incompatible boundaries arise from dopant implantation extending beyond a standard cell boundary. In ever smaller semiconductor geometries the areas required to be dopant implanted become smaller than the resolution of the dopant implantation technique. Hence it is typical for the dopant implantation to extend over a wider area than the area specified to be dopant implanted according to the design. However, because dopant implantation is carried out to provide specific physical characteristics for a particular area of semiconductor, whilst the dopant implantation may be appropriate for one area it may not be appropriate for another area and hence dopant implantation extending beyond a standard cell boundary may result in an incompatible boundary.

For example in one embodiment, the incompatible boundaries arise from a first standard cell having a first dopant implantation extending beyond a first standard cell boundary and a second cell having a second dopant implantation extending beyond a second cell boundary, said first dopant implantation and second implantation have different dopant characteristics. The different dopant characteristics of the two dopant implantation areas can result in incompatibility between the first standard cell and the second standard cell. For example the first implant dopant implantation could create a low voltage threshold area and the second dopant implantation could create high voltage threshold area, the two being incompatible were they to overlap.

In one embodiment the plurality of standard cells comprises at least one type of filler cell, the filler cell having no corresponding circuit elements in the integrated circuit. When providing an integrated circuit layout, it is useful to have filler cells available in the library of standard cells, these filler cells not having a functional equivalent in the final integrated circuit, but facilitating the placement of standard cells in the layout and providing useful characteristics such as providing additional decoupling capacitance.

These filler cells can take a variety of forms such as comprising: an undoped area; a dopant implanted area; at least an undoped area and a dopant implanted area; and a first dopant implanted area and a second dopant implanted area, said first dopant implanted area and said second dopant implanted area having different dopant characteristics. Providing different types of filler cells enables the automated tool placing the standard cells to create the integrated circuit layout to match the dopant implantations of abutting standard cells, such that incompatible boundaries do not occur.

In the situation where the incompatible boundaries arise from a first standard cell having a first dopant implantation extending beyond a first standard cell boundary and a second cell having a second dopant implantation extending beyond a second cell boundary, said first dopant implantation and second implantation have different dopant characteristics, there are various approaches that can be taken to the placement of filler cells between the first and second cell.

In one embodiment said step of generating a placement of standard cells comprises placing at least one undoped filler cell between said first standard cell and said second standard cell. The undoped filler cell can then take the dopant characteristics of the cells abutting it.

In another embodiment said step of generating a placement of standard cells comprises placing at least one filler cell between said first standard cell and said second standard cell, said at least one filler cell comprising at least an undoped area and a dopant implanted area. The dopant implanted area of the filler cell can then be chosen to match the dopant implantation of a cell abutting it on one side, and the undoped area can take the dopant characteristics of the cell abutting it on the other side.

In still another embodiment said step of generating a placement of standard cells comprises placing at least one filler cell between said first standard cell and said second standard cell, said at least one filler cell comprising at least a first dopant implanted area and a second dopant implanted area, said first dopant implanted area and said second dopant implanted area having different dopant characteristics. Each dopant implantation area of the filler cell can thus be selected to match the dopant characteristics of the standard cells abutting either side of the filler cell.

It will be appreciated that the compatibility information could take a variety of forms, but in one embodiment the compatibility information comprises information about said boundaries of said standard cells and information about placement rules for said standard cells. Hence the compatibility information comprises both information regarding the boundaries of each individual standard cell (which may be part of the standard cell data itself) and information about how those standard cells may be arranged relative to one another (e.g. compatibility rule data).

A second aspect of the present invention provides an integrated circuit having a layout generated according to the method of the first aspect of the present invention.

A third aspect of the present invention provides a computer readable medium storing a computer program for controlling a computer to perform the method according to the first aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

FIGS. 2A, 2B, 2C and 2D schematically illustrate a set of standard cells according to one example embodiment of the present invention. These standard cells 100, 105, 110, 115 have boundary regions on their left and right delimited by dashed lines 120 and 125 respectively. These boundary regions are as described with reference to FIGS. 1A 1B, 1C and 1D, in so far as they represent the limit for elements of the standard cell to approach the left and right boundaries of that standard cell without risking interference with an abutting standard cell. In FIGS. 2A, 2B, 2C and 2D, the example is taken of metal layers 130, 135, 140 and 145 in various arrangements. Thus in this illustrated example the dashed lines 120 and 125 represent the limit for the metal layer to approach the boundaries of the standard cell. In other embodiments the illustrated layers 130, 135, 140 and 145 could be considered to represent other layers of the standard cell such as, for example a polysilicon layer, a diffusion layer, a contact layer or a via layer. The dashed lines 120 and 125 would then represent the limit for the corresponding layer to approach the boundary of the standard cell. It should be noted that no significance should be attached to the fact that the metal layers 130, 135, 140 and 145 are illustrated in FIGS. 2A-D as slightly offset from their nearest boundary. This is for clarity of illustration only. For example in FIG. 2A, metal layer 130 does not quite touch boundary region delimitation lines 120 and 125, but could in principle just touch these lines. Similarly in FIG. 2B, for example, metal layers 135 do not quite reach the left and right boundaries of standard cell 105. Again, this is for clarity of illustration only and in principle the metal layers 135 could just touch the left and right boundaries of the standard cell 105.

Figure 2A:
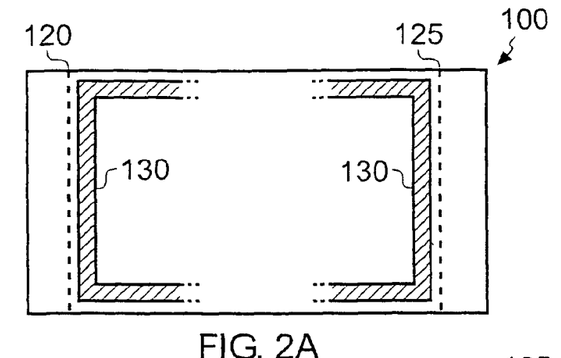
FIGS. 2A, 2B, 2C and 2D schematically illustrate standard cells according to one embodiment of the present invention.
Figure 2B:
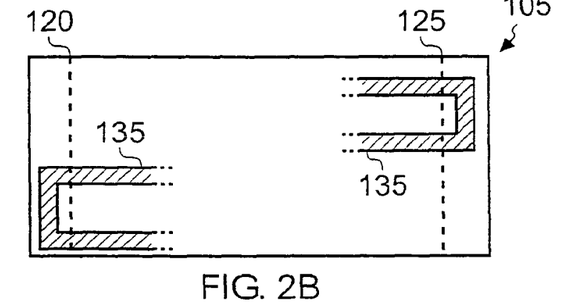
Figure 2C:
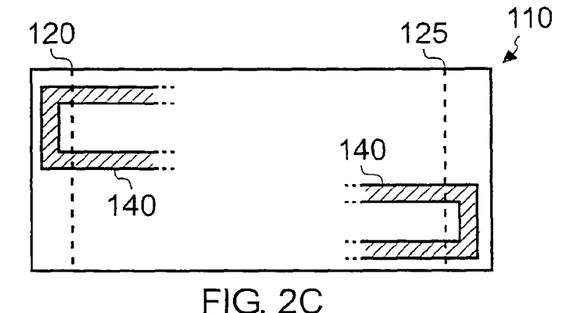
Figure 2D:
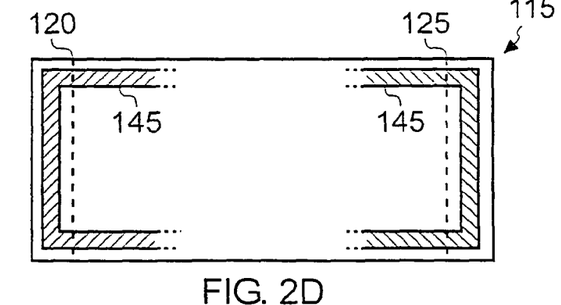
Figure 3A:
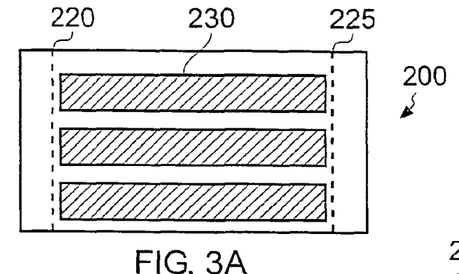
FIGS. 3A, 3B, 3C, 3D and 3E schematically illustrate collinear standard cells according to one embodiment of the present invention.
Figure 3B:
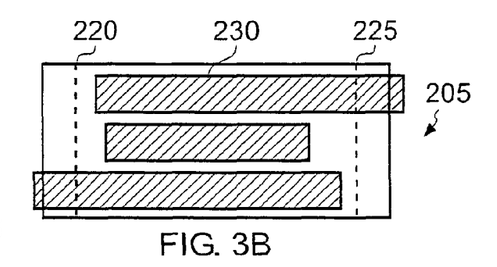
Figure 3C:
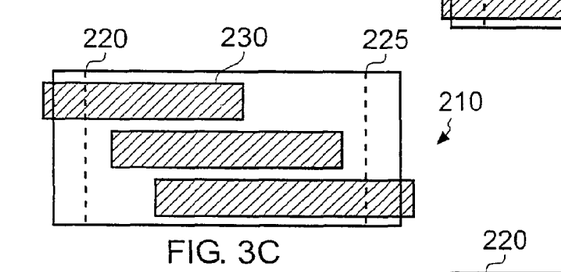
Figure 3D:
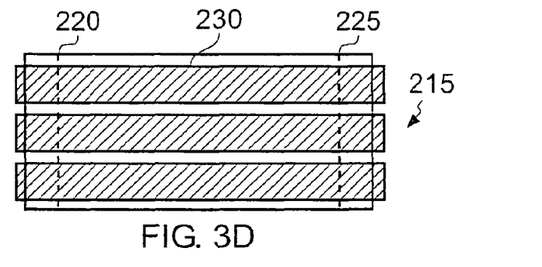
Figure 3E:
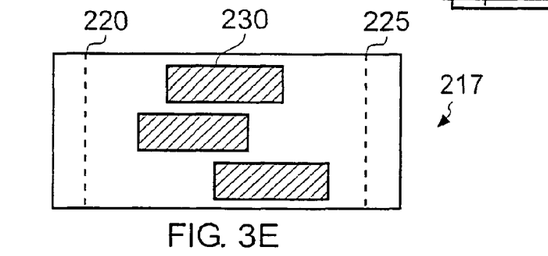

It will be recognized that although the standard cell 100 illustrated in FIG. 2A is arranged such that the metal layer 130 does not cross into the boundary regions defined by the dashed lines 120 and 125, this is not the case for the standard cells 105, 110 and 115, illustrated in FIGS. 2B, 2C and 2D respectively. The result of these latter arrangements is that the standard cells 105, 110 and 115 are not compatible with all other standard cells, since they have violated the design rules regarding proximity of the metal layer to the standard cell boundary. It should be noted that the minimum necessary spacing between the metal layers of one standard cell and the metal layers of an abutting standard cell could be shared between the two standard cells. For example two standard cells, such as standard cell 100, if placed abutting one another, would satisfy the minimum necessary spacing if the boundary regions delimited by dashed lines 120 and 125 were only half the width of that minimum necessary spacing. However for simplicity in the examples illustrated in FIGS. 2A-D, and discussed in the following, the minimum necessary spacing is provided by one standard cell of an abutting pair.

The arrangements of these standard cells introduce respective compatibilities between standard cells, which an automated tool for arranging these standard cells into an integrated circuit layout must be aware of. In the example standard cells of FIGS. 2A, 2B, 2C and 2D, and taking as a basic rule that only one of a pair of abutting standard cells may have portions of its metal layer extending into its boundary region, standard cell 100 may be placed abutting any of standard cells 105, 110 or 115, since the arrangement of its metal layer 130 does not extend into either boundary region. By contrast, standard cell 105 cannot be placed abutting either standard cell 110 or 115, since its metal layer 135 crosses into the lower portion of its left boundary region and the upper portion of its right boundary region, and placed abutting standard cell 110 or standard cell 115 would result in immediately adjacent metal layers, violating a minimum separation design rule for metal layers. However it can be seen that standard cell 105 could be placed abutting itself, since then the metal layers 135 of each standard cell would interlock, the upper right portion of one standard cell's metal layer fitting into the upper left gap in the other standard cell's metal layer (and vice versa). Note that this compatibility of standard cell 105 applies to the standard cell as illustrated, but not if the standard cell were left-right flipped. Hence it can be seen that the boundary conditions are specific to a given boundary of the standard cell and not the standard cell as a whole.

Similar boundary compatibility rules as for standard cell 105 apply to standard cell 110 (since these cells are up-down mirror images of one another), but it can be seen that standard cell 115 cannot be placed abutting either of standard cells 105 or 110, and standard cell 100 is the only standard cell which standard cell 115 can abut. Note that for clarity the arrangements of the layers 130, 135, 140 and 145 in the standard cells illustrated in FIGS. 2A, 2B, 2C and 2D exhibit a degree of symmetry, but this does not need to be the case, e.g. a standard cell could have a left half such as that of standard cell 100 and a right half such as that of standard cell 105.

Of importance to the present technique is the realization that allowing the set of standard cells not to have a standard boundary condition (wherein all standard cells may be placed abutting all other standard cells) results in the possibility to make each standard cell of smaller width, and hence the functional density of the entire resulting integrated circuit is increased. Thus it is important not to view a standard cell such as standard cell 105 in FIG. 2B as having metal layer 135 which has been extended into the boundary region defined by dashed line 125. Instead, for a given arrangement of metal layer 135, the left-right dimension of the standard cell has been reduced such that the metal layer 135 now crosses into the boundary region defined by dashed line 125. At the incremental level of reducing the width of a standard cell by one placement pitch, it is estimated that an area reduction of 5-10% can be achieved in a 32 nm architecture.

In one embodiment of the present invention the boundary compatibility rules are provided in association with the standard cell library defining the standard cells. Thus, in the process of using an automated tool to generate the integrated circuit layout (also known as electronic design automation (EDA)), the tool takes as its inputs the functional definition of the desired integrated circuit (typically in the form of a net list) and the standard cell library (including the boundary compatibility rules), and generates an arrangement of standard cells in which no abutting standard cells have incompatible boundaries. The boundary compatibility rules provided in association with the standard cell library comprise both the boundary information for the standard cells defined in that standard cell library and information about placement rules for those standard cells, such as which particular boundary types may be places directly abutting other particular boundary types.

FIGS. 3A, 3B, 3C, 3D and 3E schematically illustrate a set of standard cells according to one example embodiment of the present invention. Standard cells 200, 205, 210, 215 are a set of standard cells analogous to those illustrated in FIGS. 2A, 2B, 2C and 2D (standard cell 217 will be discussed in more detail hereinafter). However the standard cells in FIGS. 3A, 3B, 3C, 3D and 3E are provided for a generation of integrated circuits having significantly smaller geometries than the integrated circuits for which the standard cells of FIGS. 2A, 2B, 2C and 2D are provided. Since these standard cells correspond to smaller integrated circuit geometries, the layers of the standard cells are collinear, since the dimensions of the layers are such that current layering techniques cannot readily produce two-dimensional shapes (in the sense that an 'L' shape is two-dimensional, whereas a strip is considered one-dimensional).

Similarly to the set of standard cells illustrated in FIGS. 2A, 2B, 2C and 2D, the standard cells in FIGS. 3A, 3B, 3C, 3D and 3E have boundary regions on their left and right delimited by dashed lines 220 and 225 respectively. Also, analogously to the standard cells in FIGS. 2A, 2B, 2C and 2D, in this set of standard cells: the strips of the illustrated layer (for example metal layers) of standard cell 200 do not cross the lines 220, 225 defining the standard cell's boundary regions; some of the strips of standard cells 205 and 210 cross the lines 220, 225 defining the standard cell's boundary regions; all the strips of standard cell 215 cross the lines 220, 225 defining the standard cell's boundary regions; and the strips of standard cell 217 can be seen to be well within the lines 220, 225 defining the standard cell's boundary regions.

Note that in the example standard cells of FIGS. 3A, 3B, 3C, 3D and 3E, not only do some of the strips 230 cross the lines 220, 225 defining the standard cell's boundary region, they even cross into the region formally defined as outside the standard cell. This extension outside the formal boundary of the standard cell can be considered to either result from a design choice or from the natural variation in the exact dimensions of the strips (since their relative variation increases as geometries decrease). Either way, according to the present techniques this can be allowed to occur (in the knowledge that a standard cell can be placed abutting that can accommodate such an invasion). Note also that this feature of layers crossing the boundary of the standard cell is not limited to the collinear examples illustrated in FIGS. 3A-E and could also occur in the examples of FIGS. 2A-D.

Similarly to the set of standard cells illustrated in FIGS. 2A, 2B, 2C and 2D, in the set of standard cells illustrated in FIGS. 3A, 3B, 3C, 3D and 3E. Standard cell 217 can be placed abutting any of the others. Standard cell 200 can be placed abutting itself and standard cell 217. Standard cells 205 and 210 can be placed abutting themselves (if not flipped), but not abutting each other and not abutting standard cells 200 or 215. Standard cell 215 can only be placed abutting standard cell 217 (note that a standard cell such as 215 cannot abut a standard cell such as 200, since the extension of the strips of standard cell 215 beyond the standard cell boundary mean that the strips of standard cell 200 would need to be shorter (not even reaching the boundary region definition line 220, 225) in order to provide sufficient separation between the strips of one standard cell and the next. This issue does not arise with respect to standard cell 217, since the strips of standard cell 217 are well back from the boundary lines 220, 225).

Figure 4A:
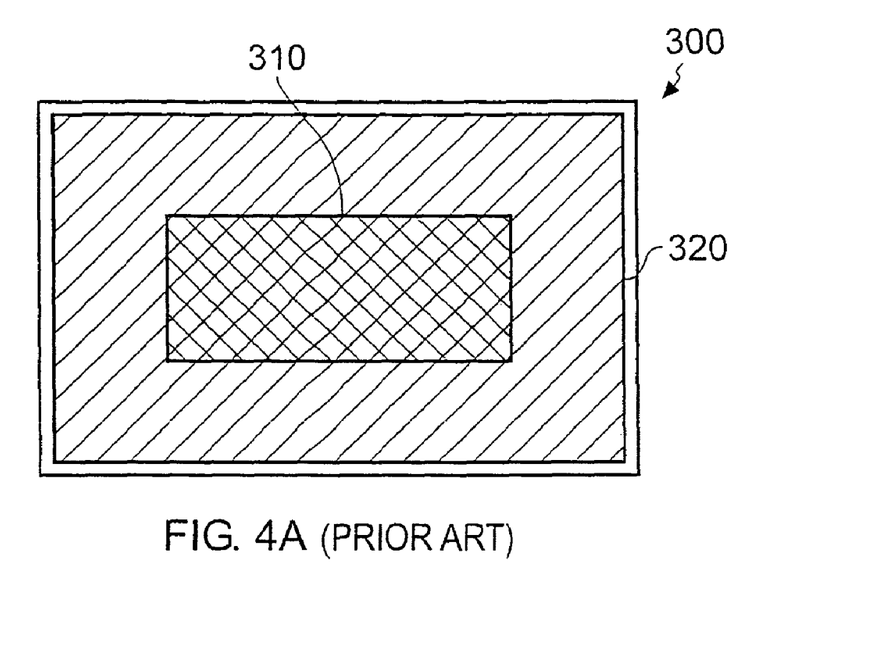
FIGS. 4A and 4B schematically illustrate dopant implantation of a known standard cell and of a standard cell according to one embodiment of the present invention.
Figure 4B:
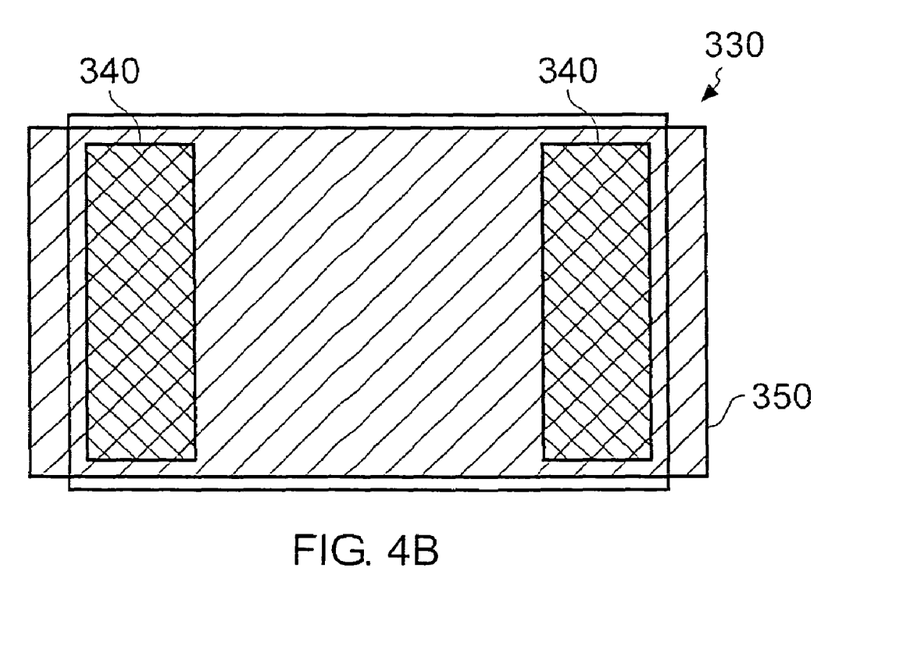

A further feature of standard cells that may result in incompatible boundaries is illustrated in FIGS. 4A and 4B. An area of integrated circuit represented by a standard cell may be doped in order to adjust at least one of its physical characteristics (e.g. its gate switching voltage threshold). Different levels of dopant result in different physical characteristics (e.g. low voltage threshold (LVT), regular voltage threshold (RVT) and high voltage threshold (HVT)).

FIG. 4A schematically illustrates an example standard cell 300 having diffusion layer 310. In order to provide the diffusion layer with the correct physical environment, the substrate of the standard cell 300 is doped, as illustrated by hatching 320. Note that for clarity the hatching is slightly offset from the standard cell, but in reality the doping would be implemented across the entire standard cell area.

A standard cell 330 according to the present techniques is illustrated in FIG. 4B. As integrated circuit geometries reduce, it has been found that the resolution at which doping implantation can be applied is not scaling with the reduction in size of placement pitch (one placement pitch currently typically being a "poly pitch"). Thus, relative to the features being defined by the layers applied to the substrate, the application of dopant implants is becoming coarser.

FIG. 4B schematically illustrates an example of particular relevance to the present techniques in which diffusion layers 340 are positioned close to the edge of their standard cell. Note that the proximity of diffusion layers 340 could still respect the boundary regions of the standard cell, or could at least partially cross into them similarly to the previously discussed examples of FIGS. 2B, 2C and 2D and FIGS. 3B, 3C and 3D. Either way, at the scale of standard cell illustrated, the diffusion layers 340 are sufficiently close to the edge of the standard cell 330, that the dopant implantation applied spreads out beyond the formal boundary of the standard cell.

In the prior art, the automated tool placing standard cells into an arrangement to generated an integrated circuit layout has not been concerned with the particular dopant implantation applied to each standard cell. That is to say the particular dopant implantation of a standard cell has not been a factor in deciding where to place that standard cell. However, as geometries shrink, as illustrated in FIG. 4B, a standard cell's dopant implantation does affect the placement of standard cells. This is because, for example, if standard cell 330 were doped as LVT, it could not be placed abutting a standard cell doped as HVT, since the implants of the two standard cells would inappropriately interact with one another.

FIGS. 5A, 5B and 5C and FIGS. 6A, 6B and 6C schematically illustrate the application of the present techniques to this issue of dopant implantation spreading beyond a standard cell. As well as standard cells representing functional components of an integrated circuit, it is known to use filler cells when arranging standard cells into an integrated circuit layout. These filler cells (a particular kind of standard cell) do not have a functional equivalent in the integrated circuit, but assist in the arrangement of standard cells which do have functional equivalents and may provide the role of increasing decoupling capacitance in a manner that is generally beneficial.

Figure 5A:
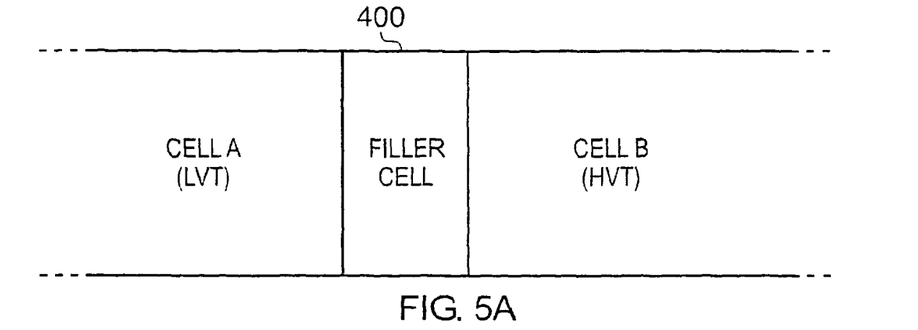
FIGS. 5A, 5B and 5C schematically illustrate filler cells between standard cells according to one embodiment of the present invention.

In FIG. 5A the standard cells A and B each have different dopant implantations, standard cell A having a dopant implantation resulting in an LVT characteristic and standard cell B having a dopant implantation resulting in an HVT characteristic. Both standard cells A and B are examples of the kind of standard cell schematically illustrated in FIG. 4B, wherein the dimensions are such that the dopant implantation has extended beyond the standard cell boundaries. Since one is LVT and the other is HVT, these two standard cells may not be placed abutting one another, as this would violate dopant implantation rules (which require that different dopant implantation areas do not overlap). Hence, a filler cell 400 is placed between them. There are various possibilities for how a filler cell can be placed in a gap between standard cells as is discussed in the following, with reference to FIGS. 6A, 6B and 6C.

Three basic approaches to these fill cells are described here. These may be categorized into two groups. The first group comprises the situation where the fill cells themselves may have dopant implantations, but those dopant implantations do not extend beyond the boundaries of the fill cell. The second comprises the situation where the fill cells themselves may have dopant implantations which extend beyond the fill cell itself.

Figure 6A:
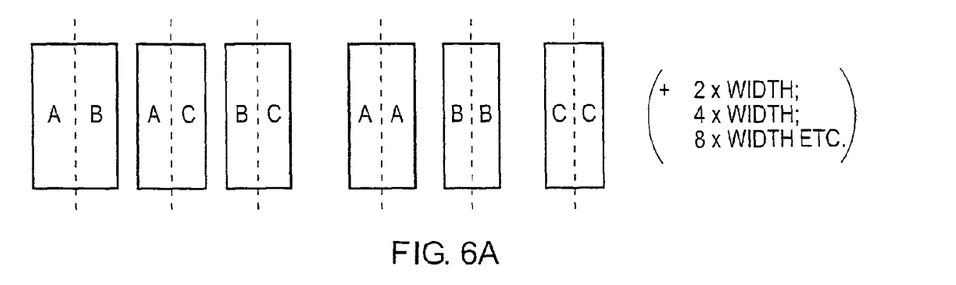
FIGS. 6A, 6B and 6C schematically illustrate different filler cell types according to embodiments of the present invention.

The first group is illustrated by the filler cells in FIG. 6A, labelled with 3 different dopant implantation types generically labelled A, B and C. Here it is necessary to provide single placement width fill cells which have all permutations of one half having one dopant implantation type and the other half having another dopant implantation type. These include having both halves having the same dopant implantation type. These need not include mirror images, so long as the standard cell placement tool is allowed to flip standard cells. If fill cells of width greater than a single placement pitch are provided (e.g. 2 wide, 4 wide, 8 wide etc.) then each of these widths should be provided in each implantation type (NB this is not strictly necessary, since any gap can in principle be filled by multiple single width fill cells).

Figure 6B:
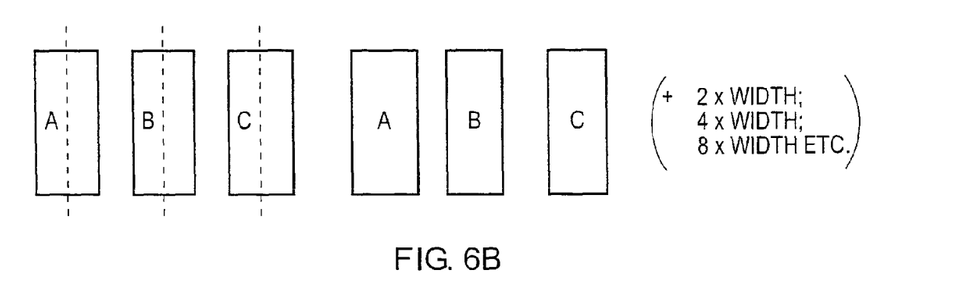
Figure 6C:
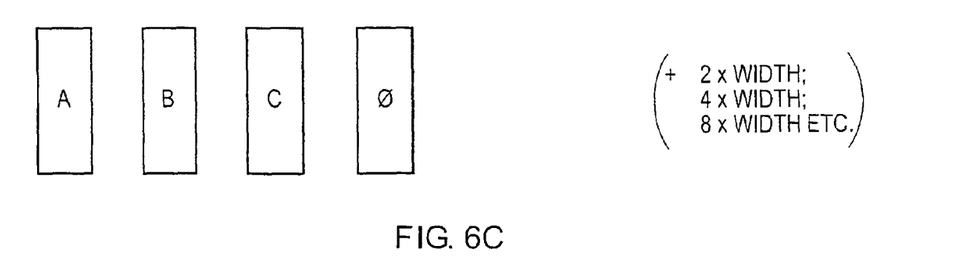

The second group is illustrated by the filler cells in FIGS. 6B and 6C. Here, the fill cells may have dopant implantations which extend beyond the boundaries of the fill cell itself (in the manner that was described above with reference to FIG. 4B). FIGS. 6B and 6C also show three different dopant implantation types generically labelled A, B and C. In this second group situation there are two approaches.

In the first approach, shown in FIG. 6B, there is one single placement pitch width filler cell provided for each dopant implantation type with only half the width having that dopant implantation, the other half being empty. Also there are wholly filled single width fillers cells provided for each dopant implantation type. Similarly to FIG. 6A, wider filler cells in each implantation type may also optionally be provided.

In the second approach, shown in FIG. 6C, there is one wholly filled single width filler cell provided in each dopant implantation type and one single width undoped filler cell (labelled 0).

Note that in the three approaches illustrated in FIGS. 6A, 6B and 6C only three dopant implantation types (generically labelled A, B, C) have been shown for simplicity. The three approaches are equally applicable to implementations with more dopant implantation types, although it will be appreciated that greater numbers of fill cell types will be required as the number of dopant implantation types grows (NB this is especially true in the case of the approach shown in FIG. 6A, due to the combinatorial permutations). These three different approaches to filler cell implementation will now be discussed with reference to the example situations of FIGS. 5B and 5C.

Figure 5B:
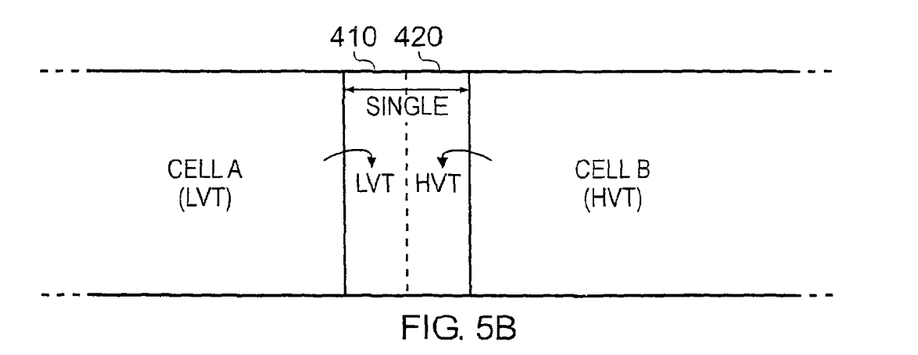

FIG. 5B schematically illustrates an arrangement where a filler cell of one placement pitch width is required. In FIG. 5B the filler cell can be seen to have two halves 410 and 420.

According to the FIG. 6A approach, a filler cell is selected to fill this gap which has its left half 410 LVT doped and its right half 420 HVT doped. The spreading of the LVT dopant implantation from standard cell A thus merely spreads into an already LVT area and the spreading of the HVT dopant implantation from standard cell B thus merely spreads into an already HVT area. Dopant implantation rules are thus respected.

According to the FIG. 6B approach, a filler cell is selected to fill this gap which has one half doped and the other half undoped. For example a filler cell is selected which has its left half 410 LVT doped and has an undoped right half 420. The spreading of the LVT dopant implantation from standard cell A thus merely spreads into an already LVT area and the spreading of the HVT dopant implantation from standard cell B spreads out by half a placement pitch to dope right half 420 as HVT. Dopant implantation rules are thus respected. Another possible solution would be to select the filler cell with the left half doped with HVT, flip the cell left-to-right and place it.

According to the FIG. 6C approach, a filler cell is selected to fill this gap which is undoped. The spreading of the LVT dopant implantation from standard cell A thus spreads by half a placement pitch to dope right half 410 as LVT and the spreading of the HVT dopant implantation from standard cell B spreads out by half a placement pitch to dope right half 420 as HVT. Dopant implantation rules are thus respected.

Figure 5C:
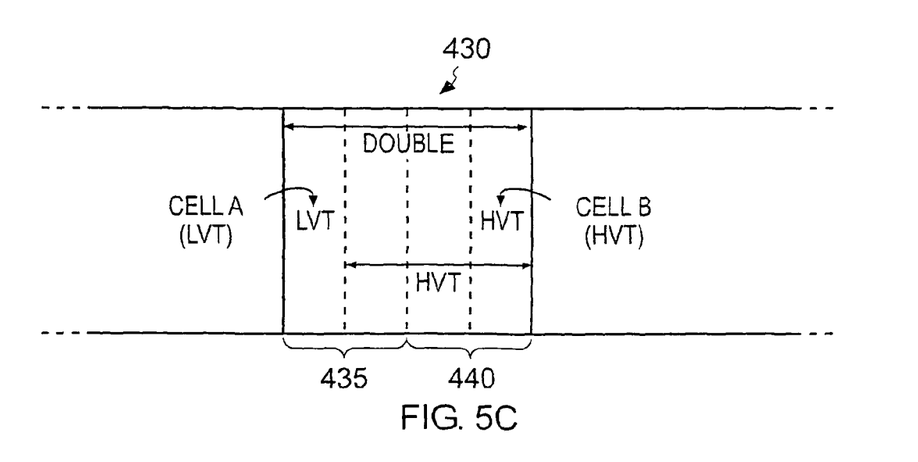

More filler cell selection possibilities arise when a wider gap between standard cells needs filling. FIG. 5C schematically illustrates an example in which standard cells A and B are placed two placement pitches apart and two single width filler cells 435 and 440 have been placed together in the gap.

According to the FIG. 6A approach, one possibility (as illustrated in FIG. 5C) is that filler cell 435 is selected having an LVT doped left half and an HVT doped right half. Filler cell 440 is then selected as being fully (i.e. both halves) HVT doped. Another possibility (not illustrated) is that the two placement pitch gap could be filled by the lefthand filler cell being a fully LVT doped filler cell and the righthand filler cell having an LVT doped left half and an HVT doped right half.

According to the FIG. 6B approach, one possibility (as illustrated in FIG. 5C) is that filler cell 435 is selected having an LVT doped left half and an undoped right half. Filler cell 440 is then selected as being fully (i.e. both halves) HVT doped. The spreading of the dopant implantation in filler cell 440 then dopes the right hand half of filler cell 435 as HVT. Another possibility (not illustrated) is that the two placement pitch gap could be filled by the lefthand filler cell being a fully LVT doped filler cell and the righthand filler cell having an undoped left half and an HVT doped right half. The spreading of the dopant implantation in filler cell 435 then dopes the left hand half of filler cell 440 as HVT.

According to the FIG. 6C approach, filler cell 435 is selected as an undoped filler cell. Filler cell 440 is then selected as being fully (i.e. both halves) HVT doped. The spreading of the dopant implantation in filler cell 440 then dopes the right hand half of filler cell 435 as HVT and the spreading of the dopant implantation in standard cell A then dopes the left hand half of filler cell 435 as LVT. Another possibility (not illustrated) is that the lefthand filler cell be fully LVT doped and the righthand filler cell is undoped. The spreading of the dopant from the lefthand fill cell and from the standard cell B then dopes the righthand filler cell.

The greater the spacing between the standard cells that needs filling, the more permutations exist of the filler cells therein. Variations are permissible, so long as they fulfill the required implantation rules. An example implantation rule is that it is not permitted in this example to have any areas undoped.

Figure 7:
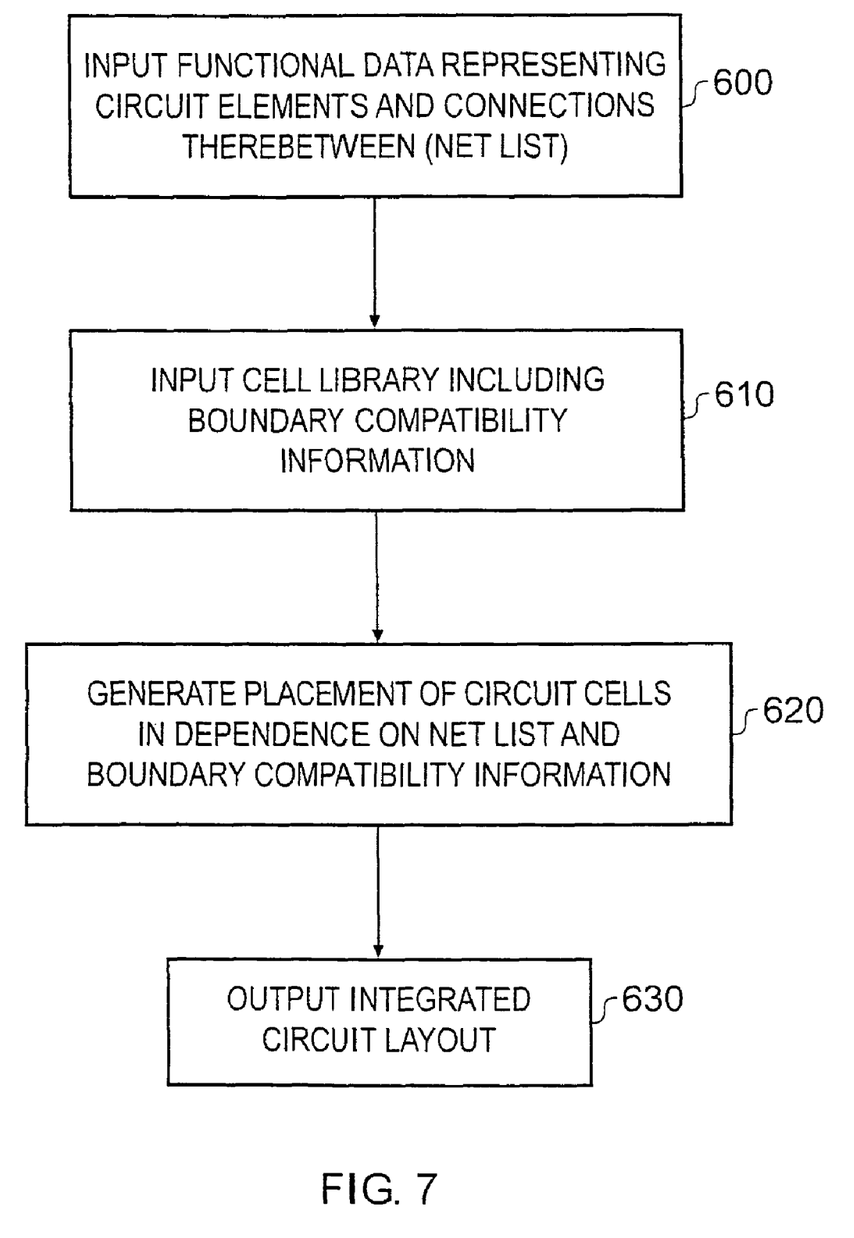
FIG. 7 schematically illustrates a series of steps taken according to one embodiment of the present invention.

FIG. 7 is a flow diagram schematically illustrating a series of steps carried out in one embodiment of the present invention. Firstly, at step 600, functional data representing circuit elements and connections between the circuit elements of the planned integrated circuit are input, typically in the format of a netlist. Next, at step 610, a cell library is input, the cell library defining standard cells. Associated with each standard cell is compatibility information indicative of the compatibility of the boundaries of that standard cell with the other standard cells. The compatibility information comprises both information about the nature of the boundaries of the standard cells and information about placement rules for those standard cells with respect to one another. Then at step 620 a placement of standard cells is generated in dependence on the functional data (netlist) and the boundary compatibility information associated with the standard cells to produce the layout such that no abutting cells have incompatible boundaries. Finally at step 630, the generated integrated circuit layout is output. Outputting this generated integrated circuit layout can take a variety of forms, but it will typically be recorded on a computer readable medium.

Figure 8:
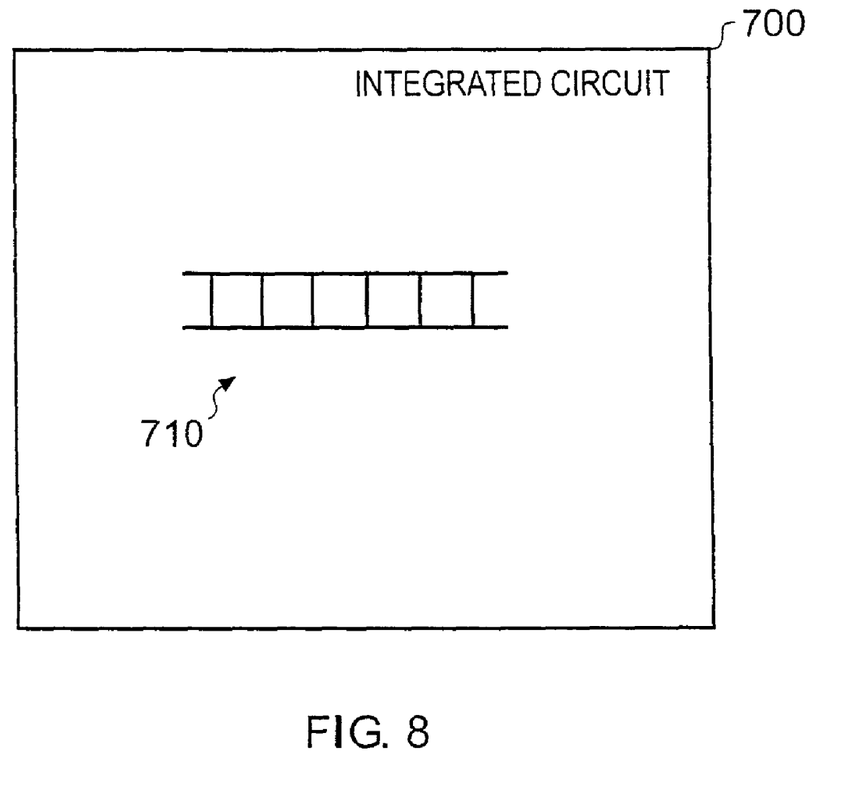
FIG. 8 schematically illustrates an integrated circuit produced according to the present techniques.

FIG. 8 represents an integrated circuit 700 generated according to the techniques of the present invention. An arrangement of standard cells is generally marked as 710, these standard cells having been arranged such that no abutting standard cells have incompatible boundaries. Only a portion of one row of arranged standard cells has been illustrated for clarity, but it will be understood that the standard cells are placed across the entirety of the planned integrated circuit.

Hence the techniques of the present invention provide a method of generating an integrated circuit layout by arranging standard cells. The particular placement of each standard cell is determined by its logical function and by compatibility information regarding its boundaries, abutting standard cells being placed such that their boundaries are compatible. By the introduction of standard cells which do not all have boundaries which are compatible with one another, smaller integrated circuit geometries may be achieved.

Figure 9:
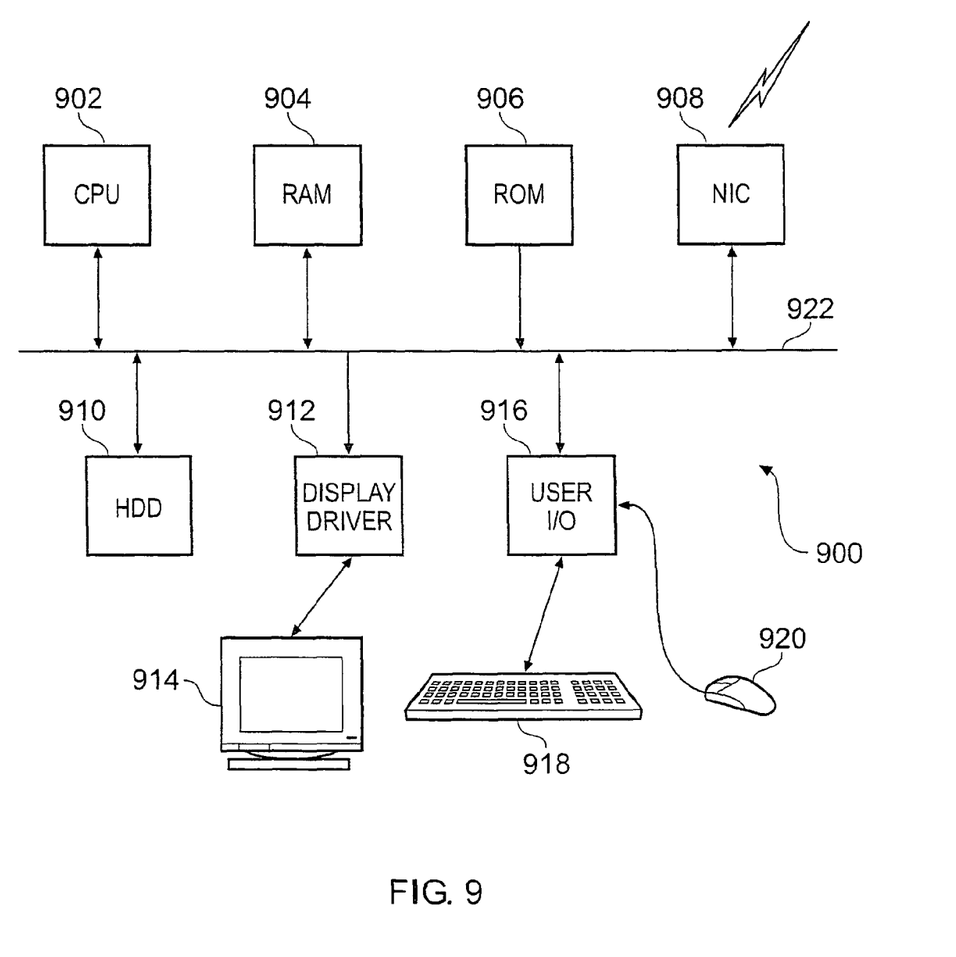
FIG. 9 schematically illustrates a general purpose computer of the type which can be used to implement the present techniques.

FIG. 9 schematically illustrates a general purpose computer 900 of the type that may be used to implement the above described techniques and in particular the generation of a layout of an integrated circuit. The general purpose computer 900 includes a central processing unit 902, a random access memory 904, a read only memory 906, a network interface card 908, a hard disk drive 910, a display driver 912 and monitor 914 and a user input/output circuit 916 with a keyboard 918 and mouse 920 all connected via a common bus 922. In operation the central processing unit 902 will execute computer program instructions that may be stored in one or more of the random access memory 904, the read only memory 906 and the hard disk drive 910 or dynamically downloaded via the network interface card 908. The results of the processing performed may be displayed to a user via the display driver 912 and the monitor 914. User inputs for controlling the operation of the general purpose computer 900 may be received via the user input output circuit 916 from the keyboard 918 or the mouse 920. It will be appreciated that the computer program could be written in a variety of different computer languages. The computer program may be stored and distributed on a recording medium or dynamically downloaded to the general purpose computer 900. When operating under control of an appropriate computer program, the general purpose computer 900 can perform the above described techniques and can be considered to form an apparatus for performing the above described technique. The architecture of the general purpose computer 900 could vary considerably and FIG. 9 is only one example.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

I claim:

1. A method of generating a layout of an integrated circuit using a computer, said integrated circuit comprised of a plurality of circuit elements and connections between circuit elements, said circuit elements comprising a variety of standard cells in abutting relationships, each of said variety of standard cells having boundaries, said method comprising the steps of:

providing the computer with functional data representing said circuit elements and said connections between said circuit elements of said integrated circuit;

providing the computer with a cell library defining said plurality of standard cells, each standard cell representing a potential component for forming said integrated circuit;

providing the computer with compatibility information indicative of compatibility of boundaries of each of said variety of standard cells; and generating on the computer a placement of standard cells in dependence on said functional data and said compatibility information so as to produce said layout such that no abutting cells have incompatible boundaries, wherein said incompatible boundaries result from positions of elements of respective standard cells relative to their respective standard cell boundaries, wherein said incompatible boundaries arise from dopant implantation extending beyond a standard cell boundary, wherein said incompatible boundaries arise from a first standard cell having a first dopant implantation extending beyond a first standard cell boundary and a second standard cell having a second dopant implantation extending beyond a second standard cell boundary, and said first dopant implantation and second implantation have different dopant characteristics.

2. A method as claimed in claim 1, wherein said integrated circuit is formed from layers on a substrate and said incompatible boundaries result from proximity of at least one of said layers to a standard cell boundary.

3. A method as claimed in claim 2, wherein said one of said layers is one of a polysilicon layer, a diffusion layer, a contact layer, a via layer and a metallisation layer.

4. A method as claimed in claim 2, wherein said layers are collinear layers.

5. A method as claimed in claim 1, wherein said plurality of standard cells comprises at least three types of standard cell, said at least three types of standard cell having different compatibility of boundaries from one another.

6. A method as claimed in claim 1, wherein said plurality of standard cells comprises at least one type of standard cell having boundaries which are compatible with all other types of standard cell.

7. A method as claimed in claim 1, wherein said plurality of standard cells comprises at least one type of standard cell having a standard cell boundary which is only compatible with one other type of standard cell boundary.

8. A method as claimed in claim 1, wherein said plurality of standard cells comprises at least one type of filler cell.

9. A method as claimed in claim 8, wherein said at least one type of filler cell comprises an undoped area.

10. A method as claimed in claim 8, wherein said at least one type of filler cell comprises a dopant implanted area.

11. A method as claimed in claim 8, wherein said at least one type of filler cell comprises at least an undoped area and a dopant implanted area.

12. A method as claimed in claim 1, wherein said step of generating a placement of standard cells comprises placing at least one undoped filler cell between said first standard cell and said second standard cell.

13. A method as claimed in claim 1, wherein said step of generating a placement of standard cells comprises placing at leas t one filler cell between said first standard cell and said second standard cell, said at least one filler cell comprising at least an undoped area and a dopant implanted area.

14. A method as claimed in claim 1, wherein said step of generating a placement of standard cells comprises placing at least one filler cell between said first standard cell and said second standard cell, said at least one filler cell comprising at least a first dopant implanted area and a second dopant implanted area, said first dopant implanted area and said second dopant implanted area having different dopant characteristics.

15. A method as claimed in claim 1, wherein said compatibility information comprises information about said boundaries of said standard cells and information about placement rules for said standard cells.

16. An integrated circuit having a layout generated according to the method of claim 1.

17. A non-transitory computer readable storage medium storing a computer program for controlling a computer to perform the method according to claim 1.

18. A method of generating a layout of an integrated circuit using a computer, said integrated circuit comprised of a plurality of circuit elements and connections between circuit elements, said circuit elements comprising a variety of standard cells in abutting relationships, each of said variety of standard cells having boundaries, said method comprising the steps of:
provide the computer with functional data representing said circuit elements and said connections between said circuit elements of said integrated circuit;
providing the computer with a cell library defining said plurality of standard cells, each standard cell representing a potential component for forming said integrated circuit;
providing the computer with compatibility information indicative of compatibility of boundaries of each of said variety of standard cells; and
generating on the computer a placement of standard cells in dependence on said functional data and said compatibility information so as to produce said layout such that no abutting cells have incompatible boundaries, wherein said incompatible boundaries result from positions of elements of respective standard cells relative to their respective standard cell boundaries, wherein said plurality of standard cells comprises at least one type of filler cell, wherein said at least one type of filler cell comprises a first dopant implanted area and a second dopant implanted area, said first dopant implanted area and said second dopant implanted area having different dopant characteristics.

* * * * *